US010971681B2

(12) United States Patent
Bozdag et al.

(10) Patent No.: US 10,971,681 B2
(45) Date of Patent: Apr. 6, 2021

(54) METHOD FOR MANUFACTURING A DATA RECORDING SYSTEM UTILIZING HETEROGENEOUS MAGNETIC TUNNEL JUNCTION TYPES IN A SINGLE CHIP

(71) Applicant: Spin Transfer Technologies, Inc., Fremont, CA (US)

(72) Inventors: Kadriye Deniz Bozdag, Sunnyvale, CA (US); Eric Michael Ryan, Fremont, CA (US); Kuk-Hwan Kim, San Jose, CA (US)

(73) Assignee: SPIN MEMORY, INC., Fremont, CA (US)

( * ) Notice: Subject to any disclaimer, the term of this patent is extended or adjusted under 35 U.S.C. 154(b) by 237 days.

(21) Appl. No.: 16/211,167

(22) Filed: Dec. 5, 2018

(65) Prior Publication Data

US 2020/0185601 A1 Jun. 11, 2020

(51) Int. Cl.

| | |
|---|---|
| ***H01L 43/12*** | (2006.01) |
| ***H01L 43/02*** | (2006.01) |
| ***H01L 43/08*** | (2006.01) |
| ***H01L 27/22*** | (2006.01) |
| ***G11C 11/00*** | (2006.01) |

(Continued)

(52) U.S. Cl.
CPC .............. *H01L 43/12* (2013.01); *G11C 11/15* (2013.01); *G11C 11/161* (2013.01); *H01L 43/02* (2013.01); *H01L 27/222* (2013.01); *H01L 43/08* (2013.01)

(58) Field of Classification Search
CPC ......... H01L 43/02; H01L 43/12; H01L 43/08; H01L 27/222; G11C 11/161; G11C 11/005; G11C 11/15
See application file for complete search history.

(56) References Cited

U.S. PATENT DOCUMENTS 6,169,686 B1 * 1/2001 Brug ...................... B82Y 10/00 365/171
6,275,411 B1 * 8/2001 Daughton ............. B82Y 10/00 365/158
10,847,198 B2 11/2020 Bozdag et al.

(Continued)

OTHER PUBLICATIONS

Non-Final Office Action from U.S. Appl. No. 16/178,105, dated Mar. 13, 2020.

(Continued)

*Primary Examiner* — Errol V Fernandes
*Assistant Examiner* — Jeremy J Joy
(74) *Attorney, Agent, or Firm* — Zilka-Kotab, P.C.

(57) ABSTRACT

A method for manufacturing an array of magnetic memory elements, wherein first memory element types are formed in a first region and second type of magnetic memory element types are formed in a second region. A shadow-mask is used during deposition to limit the deposition of at least one layer of memory element material to only the second region wherein the second memory element types are to be formed. The method can include depositing full film magnetic memory element layers over an entire substrate and then using the shadow-mask to deposit at least one performance altering material in the second memory element region. Alternatively, a first shadow-mask can be used to deposit a series of first memory element layers in a first region, and a second shadow-mask can be used to deposit a plurality of second memory element layers in a second region.

12 Claims, 20 Drawing Sheets

(51) Int. Cl.
*G11C 11/15* (2006.01)
*G11C 11/16* (2006.01)

(56) References Cited

U.S. PATENT DOCUMENTS

2004/0174728 A1* 9/2004 Takano ............... H01L 27/0207 365/145
2005/0177679 A1* 8/2005 Alva .................. G06F 11/1064 711/104
2005/0214953 A1* 9/2005 Lee ...................... H01L 27/222 438/3
2015/0089261 A1 3/2015 Segawa et al.
2016/0149122 A1* 5/2016 Sullivan .................. H01L 43/12 438/3
2016/0163973 A1* 6/2016 Pinarbasi ................ H01L 43/02 438/3
2016/0233422 A1* 8/2016 Jo ........................... H01L 45/08
2016/0267957 A1* 9/2016 Lu ....................... G11C 11/1673
2016/0372174 A1 12/2016 Ohsawa et al.
2017/0040531 A1* 2/2017 Chung .................. H01L 21/266
2017/0222132 A1* 8/2017 Pinarbasi ................ H01L 43/12
2017/0256708 A1* 9/2017 Krounbi .................. H01L 43/02
2018/0040809 A1* 2/2018 Moon ..................... H01L 43/08
2018/0081570 A1 3/2018 Abe et al.
2018/0341588 A1 11/2018 Ramanujan et al.
2019/0206465 A1 7/2019 Bozdag et al.
2019/0214554 A1* 7/2019 Li ......................... H01F 10/329
2019/0384837 A1 12/2019 Kumar et al.
2020/0143862 A1 5/2020 Bozdag et al.

OTHER PUBLICATIONS

Bozdag et al., U.S. Appl. No. 16/178,105, filed Nov. 1, 2018.

Wang et al., "Designing Scratchpad Memory Architecture with Emerging STT-RAM Memory Technologies," IEEE, 2013, pp. 1244-1247.

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme," IEEE, 2015, pp. 628-631.

Langguth, D., "Scratchpad memory vs Caches—Performance and Predictability comparison," 2015, pp. 1-17, retrieved from https://es.cs.uni-kl.de/publications/data/Lang15.pdf.

Non-Final Office Action from U.S. Appl. No. 16/178,105, dated Oct. 30, 2019.

Corrected Notice of Allowance from U.S. Appl. No. 16/178,105, dated Oct. 23, 2020.

Notice of Allowance from U.S. Appl. No. 16/178,105, dated Jul. 21, 2020.

* cited by examiner

METHOD FOR MANUFACTURING A DATA RECORDING SYSTEM UTILIZING HETEROGENEOUS MAGNETIC TUNNEL JUNCTION TYPES IN A SINGLE CHIP

FIELD OF THE INVENTION

The present invention relates to magnetic random-access memory (MRAM) and more particularly to a method for manufacturing a magnetic memory system that incorporates different types of memory elements in a single memory chip in order to optimize performance and data retention.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a “1”, whereas the high resistance state can be read as a “0”. In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a “1” or “0” bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

Magnetic memory cells such as those described above can be designed to meet various performance parameters that are at competing interests. For example, magnetic memory cells can be designed to have high data retention and also high thermal stability. This allows the data to be stored reliably over a long period of time and over a wide range of environmental conditions. However, such memory elements tend to require a large amount of energy to write data and have long write times (poor latency). On the other hand, memory elements can be designed for low power consumption and fast write times. However, such memory elements tend to have lower data retention and lower thermal stability. Therefore, there remains a need for a magnetic memory system that can efficiently meet all of these competing needs.

SUMMARY

The present invention provides a method for manufacturing an array of magnetic memory elements. The method includes depositing a first magnetic memory element material using a first shadow-mask that is configured to allow deposition in a first area, and then depositing a second magnetic element material using a second shadow-mask that is configured to allow deposition in a second area. A mask can then be formed over the first and second areas, the mask being configured to define a plurality of magnetic element pillars and a material removal process can be performed to remove portions of the first and second magnetic element material not covered by the mask to define an array magnetic element pillars. In this way the first and second areas can be processed at the same time, for greater efficiency.

In an alternate embodiment, a plurality of magnetic element materials can be deposited full film. During or after the deposition of the full film plurality of magnetic element material layers, a performance altering layer can be deposited using a shadow-mask that is configured to allow deposition only in areas where a second type of magnetic memory elements are to be formed. If the thickness of the performance altering layer is sufficient to affect the milling or etching during pillar formation, a non-magnetic, electrically conductive dummy layer can be deposited in the regions not covered by the performance altering layer in order to compensate for the additional thickness of the performance altering layer.

The process can be used to form a first type of magnetic elements in a first region and a second type of magnetic element types in a second region. The first and second magnetic memory element types can have one or more performance parameters that are different from one another by one or more of: latency, retention, switching energy, magnetic anisotropy, etc.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
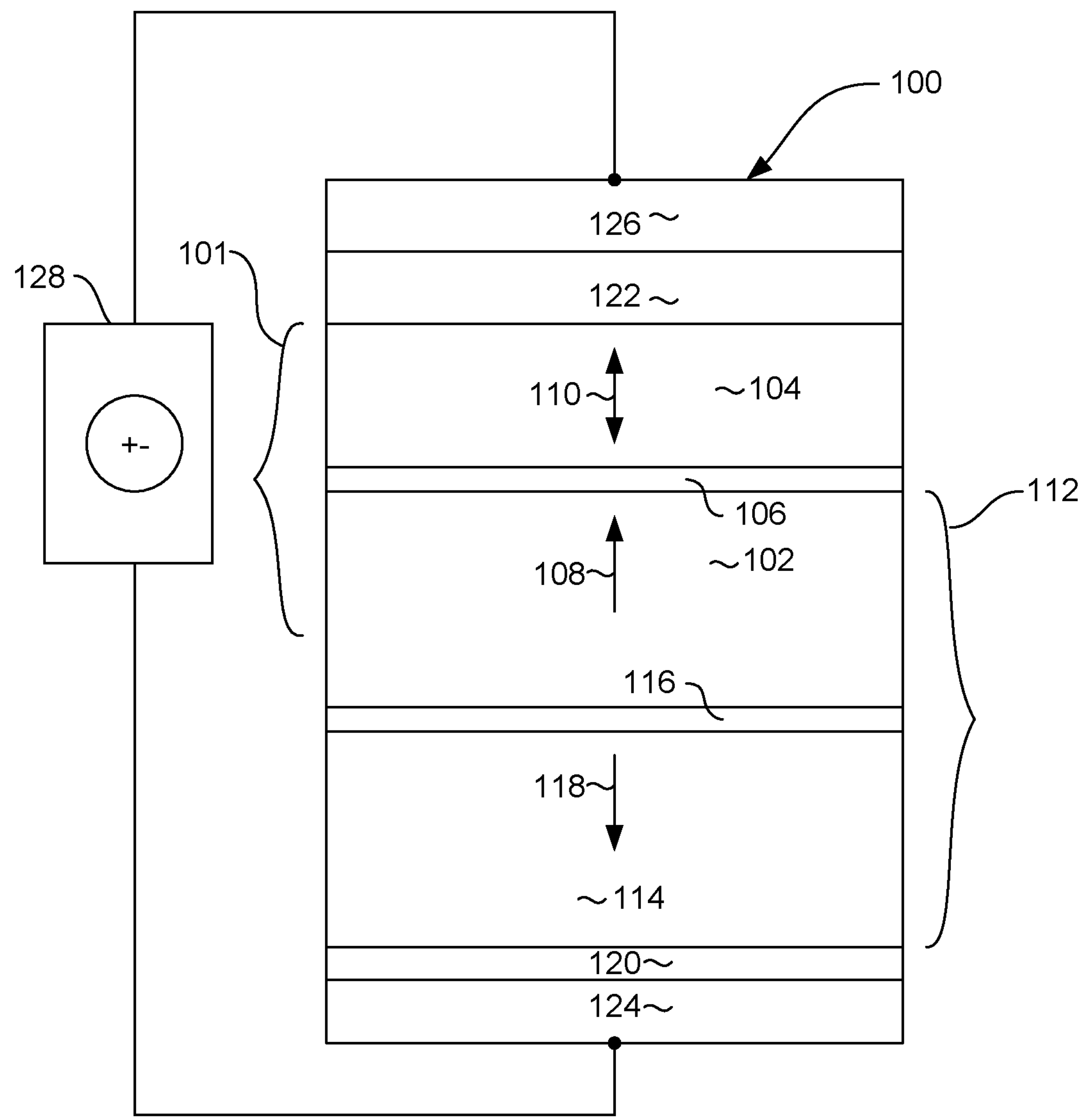
FIG. 1 is a schematic, cross sectional view of a perpendicular magnetic tunnel junction (pMTJ) element.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

Magnetic memory elements such as the magnetic memory element 100 of FIG. 1 can be designed to meet various often competing performance parameters. It is desirable that the memory element be easily written to so that it has a fast switching speed and requires low power to switch the magnetic state 110 of the magnetic free layer 104 in order to write a bit of data to the memory element 100. On the other hand, it is also desirable that the memory element be magnetically and thermally stable so that once a bit of data is written to the memory element 100 it remains reliably recorded for a long period of time (having a high retention) and is also thermally stable over a wide range of operating and environmental conditions. Examples of design characteristics that can affect write speed, latency, switching power, data retention and thermal stability include the shape and material selection of the magnetic free layer 104, along with other parameters that affect the magnetic anisotropy.

A memory element can be designed to have fast writing at low power, however, such a memory element will typically have a low retention and low thermal stability. On the other hand, the magnetic write element can be designed to have a high retention and high thermal stability, but at the cost of slower write speed and higher switching power. Therefore, design of magnetic memory system has involved a tradeoff between these competing interests. The present invention, embodiments of which are illustrated herein below overcomes this challenge by providing a system which can incorporate heterogeneous magnetic memory element types in a single memory system, wherein the best advantages of the different memory element types can be used to optimize write speed, reduced power consumption, data retention and thermal stability.

Figure 2:
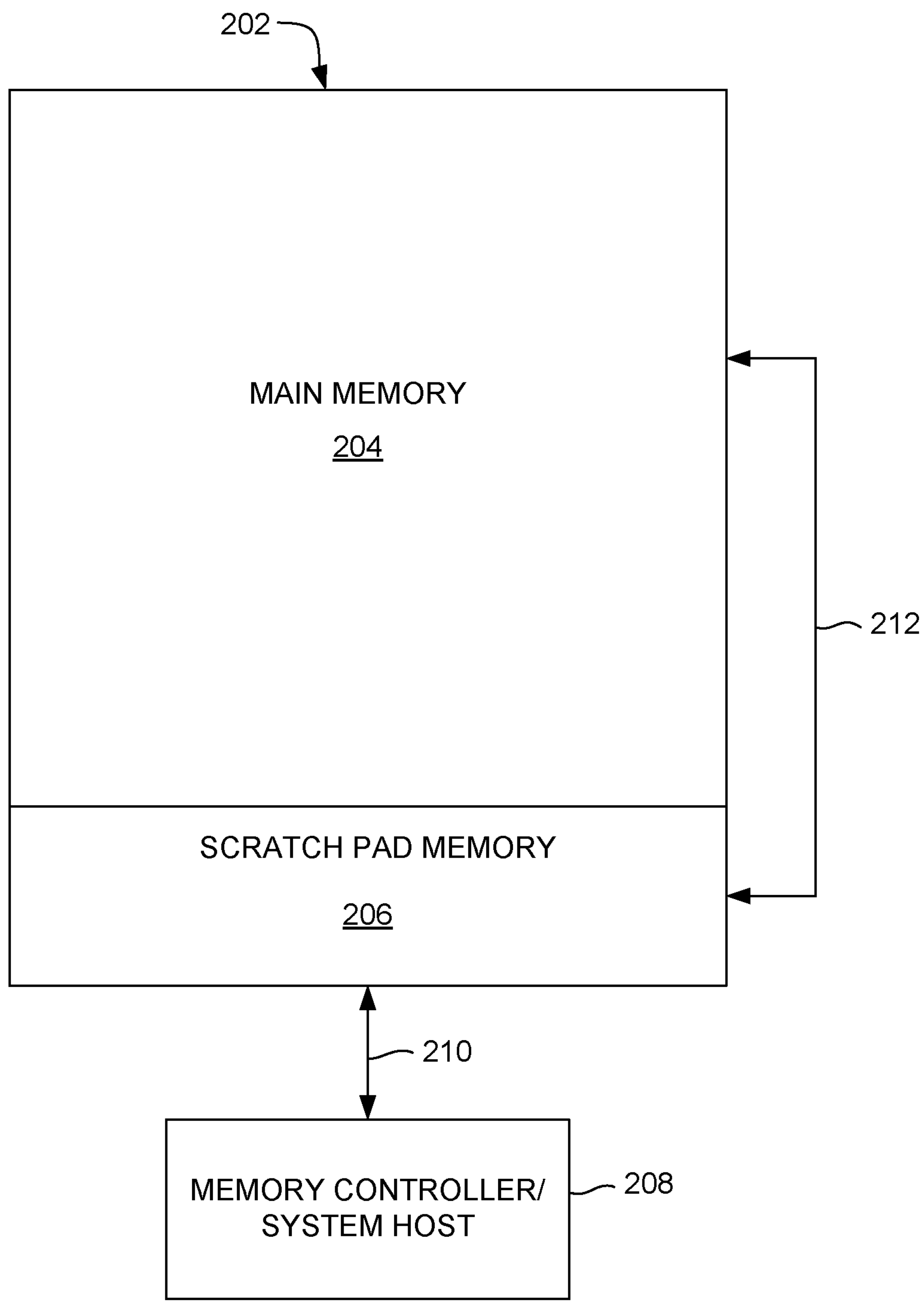
FIG. 2. is a schematic illustration of a magnetic random-access memory system utilizing scratch pad memory and incorporating heterogeneous memory element types.

FIG. 2 shows a schematic illustration of a memory system that includes a memory array 202. The memory array 202 includes a first or main memory storage region 204 and a second or temporary memory region 206, which can be configured as scratchpad memory. Data input and output to and from the temporary memory array portion 206 can be controlled by a memory controller 208.

The main memory portion 204 and temporary, scratch pad memory portion 206 contain different types of memory elements. The main memory portion 204 includes magnetic memory elements of a first type having a structure that is configured for relatively high data retention and thermal stability, but also higher power consumption and longer write time [($MTJ_1$ with $\Delta_1$, $J_{co,1}$, $\eta_1$, $\alpha_1$, $TMR_1$), where $MTJ_1$ represents the first magnetic memory element type, $\Delta_1$ is the energy barrier between the high and low resistance states of $MTJ_1$, $J_{co,1}$ is the critical current density above which switching occurs, $\eta_1$ is the spin torque efficiency of $MTJ_1$, $\alpha_1$ is the Gilbert damping parameter of $MTJ_1$, and $TMR_1$ is the Tunneling MagnetoResistance of $MTJ_1$.] On the other hand, the scratch pad memory portion 206 includes magnetic memory elements that are configured to maximize switching speed and reduced switching power consumption, but which may also have lower data retention [($MTJ_2$ with $\Delta_2$, $J_{co,2}$, $\eta_2$, $\alpha_2$, $TMR_2$), where $MTJ_2$ represents the second magnetic memory element type, and the other symbols represent the same parameters as above, but for the second magnetic memory element type instead of the first.] In other words, the scratch pad memory comprises memory elements that have a faster switching speed and lower switching power consumption than the memory elements of the main memory. Conversely, the main memory portion 204 comprises memory elements having a longer data retention and higher thermal stability than the memory elements of the scratch pad memory portion 206. For example, the main memory portion 204 can include magnetic memory elements that are configured with a shape and material composition that cause the magnetic free layer (e.g. 104 in FIG. 1) to have a stronger perpendicular magnetic anisotropy than the magnetic free layer of the magnetic memory elements of the scratch pad memory.

Scratch pad memory is an on-chip memory, and could be software managed or fully hardware managed with minimal logic function in the memory controller. Scratch pad memory has a simple structure compared with cache memory. Scratch pad memory does not require tag array or relevant comparison logic. Also, scratch pad memory is more energy and area efficient than cache memory, and also provides better timing predictability in real-time systems.

Energy consumption is an important design parameter for embedded data memory systems. Since on-chip cache memory usually consumes 25% to 45% of the total chip power and significant portion of the area, the on-chip memory in an embedded processor can be configured as a hardware/software-managed scratch pad memory instead to reduce power consumption and area penalty. The scratch pad memory does not have the tag array and relevant comparison logic that cache memory uses to support the fast lookup and dynamic mapping of data or instructions in off chip memory. Therefore, scratch pad memory is more energy- and area efficient than cache memory. Moreover, scratch pad memory could be managed by software program or built-in hardware logic, which can provide better timing predictability in real-time systems without being dependent on cache hit. Therefore, while the temporary memory portion 206 could be other types of memory, such as cache memory, it is preferably configured as scratchpad memory.

The memory controller 208 includes computer executable logic software that is functional to communicate data to and from the scratch pad memory as indicated by arrow 210. Because the scratch pad memory 206 has memory elements that are configured for quick, low power writing, the data inputted from the memory controller 208 can be quickly input at a low power consumption.

Once the data has been input to the scratch pad memory, all or a portion of the data that is desired for storage for use at a later time can be loaded (flushed) from the scratch pad memory 206 to the main memory 204 as indicated by arrow 212. In addition, data can be delivered directly from the memory controller 208 to the main memory 204 if desired as will be described in greater detail herein below. Once the data has been stored to the main memory 204 it will be reliably stored as a result of the above-mentioned high retention and thermal and magnetic stability of the memory elements of the main memory 204.

Figure 3:
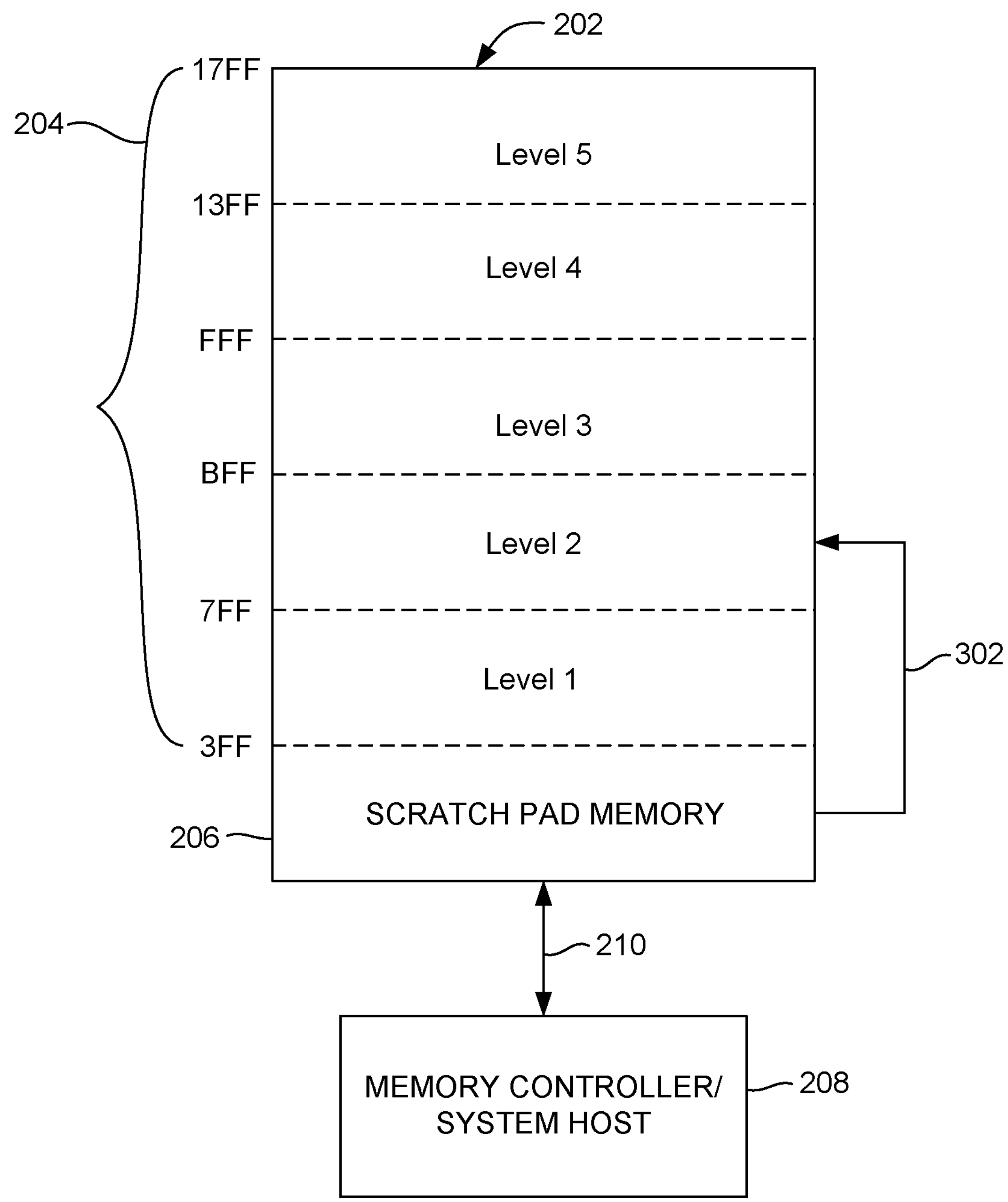
FIG. 3 is a schematic illustration of a magnetic random-access memory system utilizing scratch pad memory and incorporating heterogeneous memory element types and illustrating the use of a memory controller to communicate data to the scratch pad memory.

FIG. 3, shows a schematic view of an embodiment, wherein the main memory is divided into a plurality of storage segments. Suppose the main memory contains storage addressable from ADDR 0x000 to ADDR 0x17FF. The total address space is divided into six segments. One of them is assigned as scratch pad memory whereas others are assigned as main memory (e.g. LEVEL1, LEVEL2, etc.). Based on the address map shown in FIG. 3, any memory operation with input address ranged from 0x000 to 0x3FF should operate on $MTJ_2$. Otherwise, all memory operation on other input address range will operate on $MTJ_1$ which has better retention. The memory controller 208 can include software instruction or hardware logic that is functional to flush data from the scratch pad memory 206 to a desired one or more of the sectors of the main memory 204 as indicated by line 302.

With regard to flush operation indicated by line 302, generating flush instruction could be either automatically generated by built-in hardware logic in the memory controller or by a software program during program compilation. The hardware logics and compiled software generate the flush instruction based on many heuristics such as temporal locality of accessing address patterns from computing system, idle CPU cycles, and memory controller configuration bits.

Figure 4:
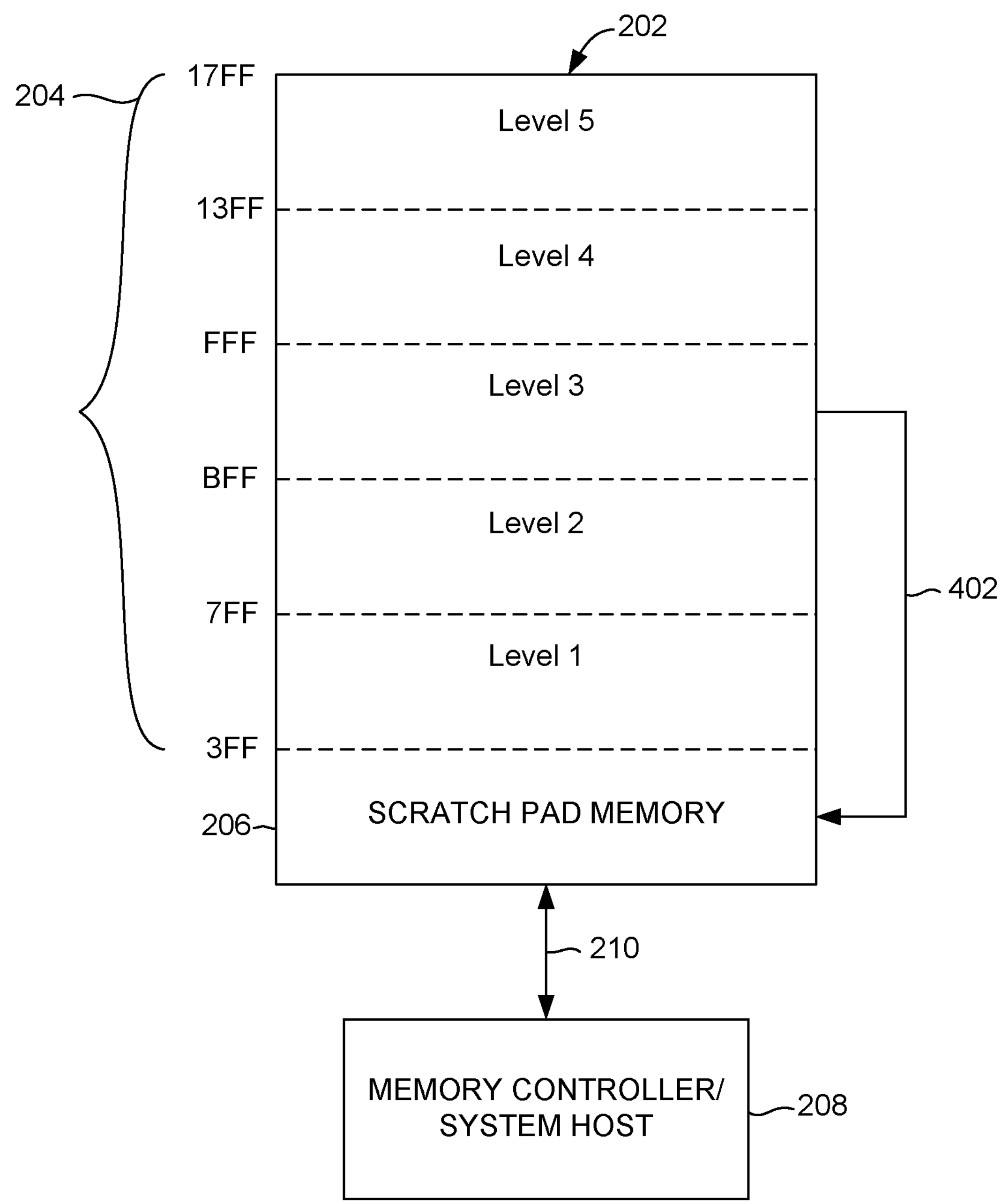
FIG. 4 is a schematic illustration of a magnetic random-access memory system utilizing scratch pad memory and incorporating heterogeneous memory element types and illustrating the communication of data between scratch pad memory and a level of memory in a main memory portion of an array.
Figure 5:
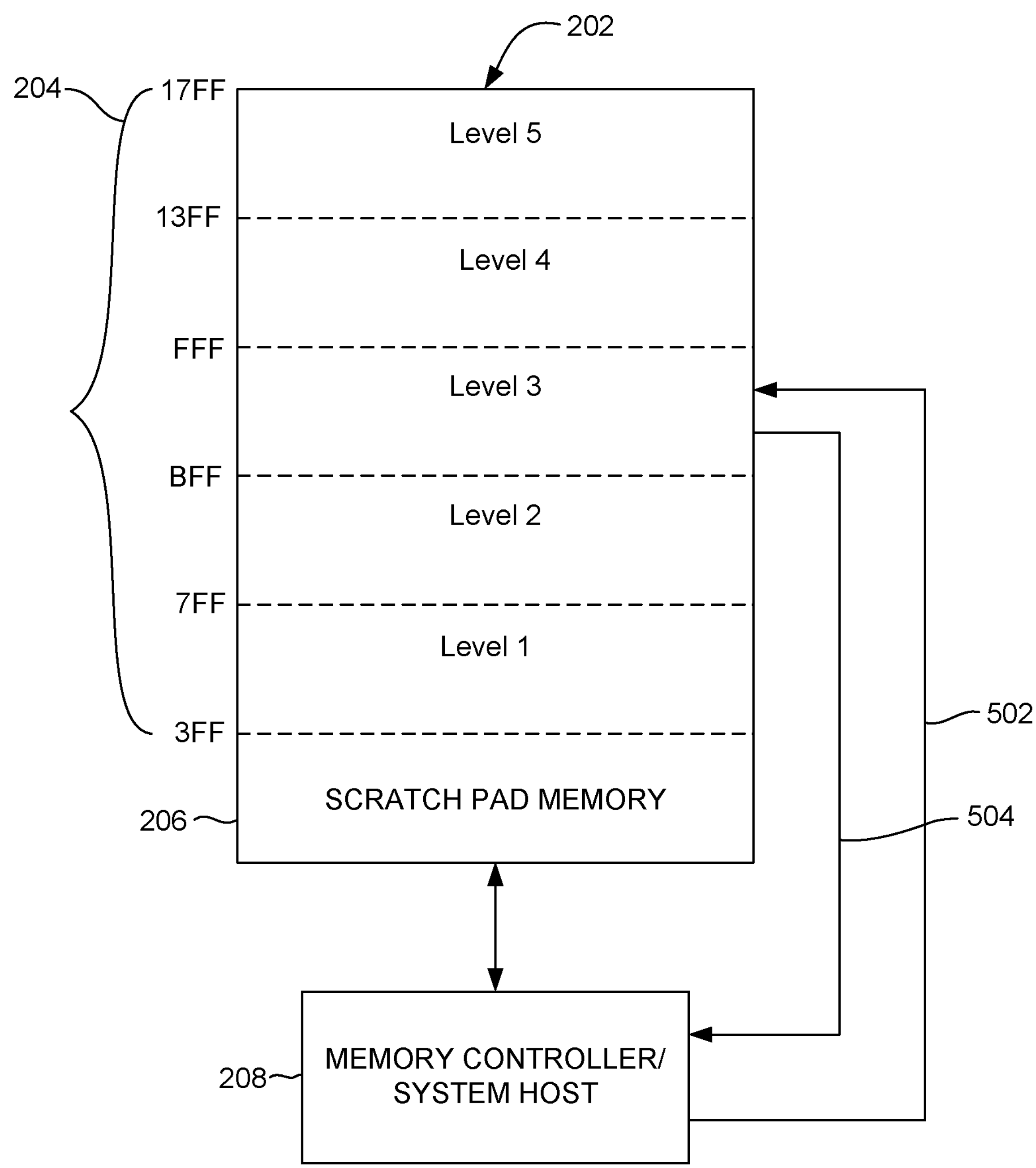
FIG. 5 is a schematic illustration of a magnetic random-access memory system utilizing scratch pad memory and incorporating heterogeneous memory element types and illustrating the direct input and output of data to and from a main memory portion of a memory array.

Conversely, as indicated by arrow 402 in FIG. 4, the memory controller 208 can include software that is functional to retrieve data from a given desired sector of the main memory 204 and store that data in the scratch pad memory 206 for later use. In addition, the memory controller 208 can be functional to write data directly to a sector of the main memory 204 as indicated by arrow 502 or to read data directly from a desired sector of the main memory 204 as indicated by arrow 504.

While the above description of embodiments of the invention have involved the use of scratch pad memory as a desired type of memory for initially storing data prior to flushing to a main memory for longer term storage, this is by way of describing a possible exemplary embodiment. The initial storage 206 having low latency, low power consumption magnetic memory elements could also be some other form of memory. For example, the memory region 206 could be a cache type memory having hardware structures that assist and determine the allocation of recorded data. The general concept is that data initially recorded to the memory system 202 can be recorded to an initial recording region having magnetic memory elements that are configured for fast writing (low latency) and low write power consumption, whereas the main memory region 204 has memory elements that are configured for higher data retention and thermal stability.

Figure 6:
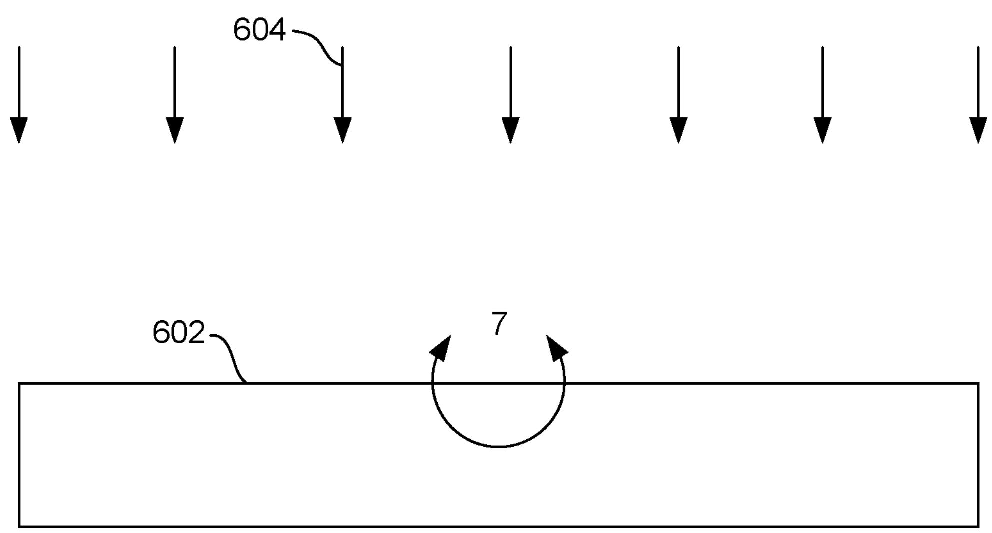
FIGS. 6-15 are views of a wafer in various intermediate stages of manufacture illustrating a method for manufacturing a magnetic memory array according to an embodiment.
Figure 7:
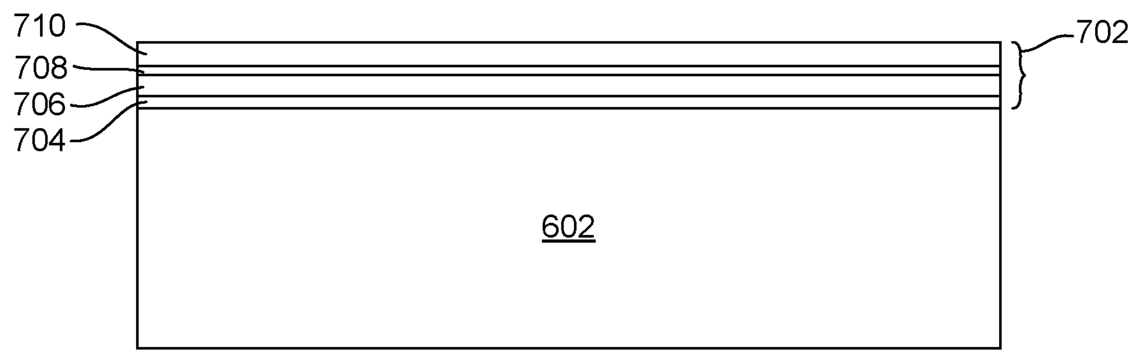

FIGS. 6-16 show cross-sectional and top down views of a portion of a wafer in various intermediate stages of manufacture, illustrating a method for manufacturing a magnetic data array according to an embodiment. With reference to FIG. 6, which shows a side, cross-sectional view of a portion of a substrate 602, such as a Si wafer or other suitable wafer, a first series of material layers are deposited full film as indicated by arrows 604. This first series of material layers can be deposited everywhere, evenly across the wafer 602. As shown in FIG. 7 which is an enlarged view as seen from circle 7 of FIG. 6, this first series of material layers 702 can be a series of layers that are configured to make up a portion of a magnetic memory element structure and may include a seed layer 704, a magnetic reference layer 706, a non-magnetic barrier layer 708 and a portion of a magnetic free layer 710. This is by way of example as the first series of layers 702 could include various other layers as well (such a layer of a synthetic antiferromagnetic structure) or could include less layers as well, depending on the layers to be modified between first and second magnetic element types as will be seen.

Figure 8:
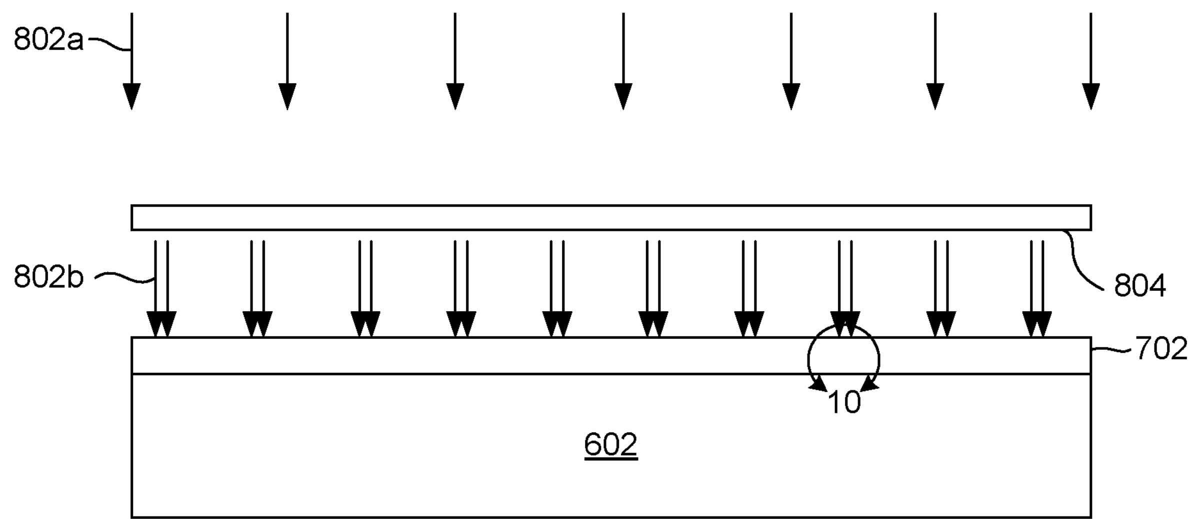

With reference now to FIG. 8, a second deposition process is performed as indicated by arrows 802*a*, 802*b*. This second deposition 802 is performed using shadow-mask 804. The shadow-mask 804 has openings that allow deposition to occur only in the areas of the openings, with the remaining portion being "shadowed" by the mask 804. On certain portions of the wafer, deposition beam 802*a* will be blocked by mask 804, leading to no deposition, but on portions of the wafer corresponding to openings in 804, deposition 802*a* will proceed through the opening and become 802*b*, resulting in deposition on that portion of the wafer.

Figure 9:
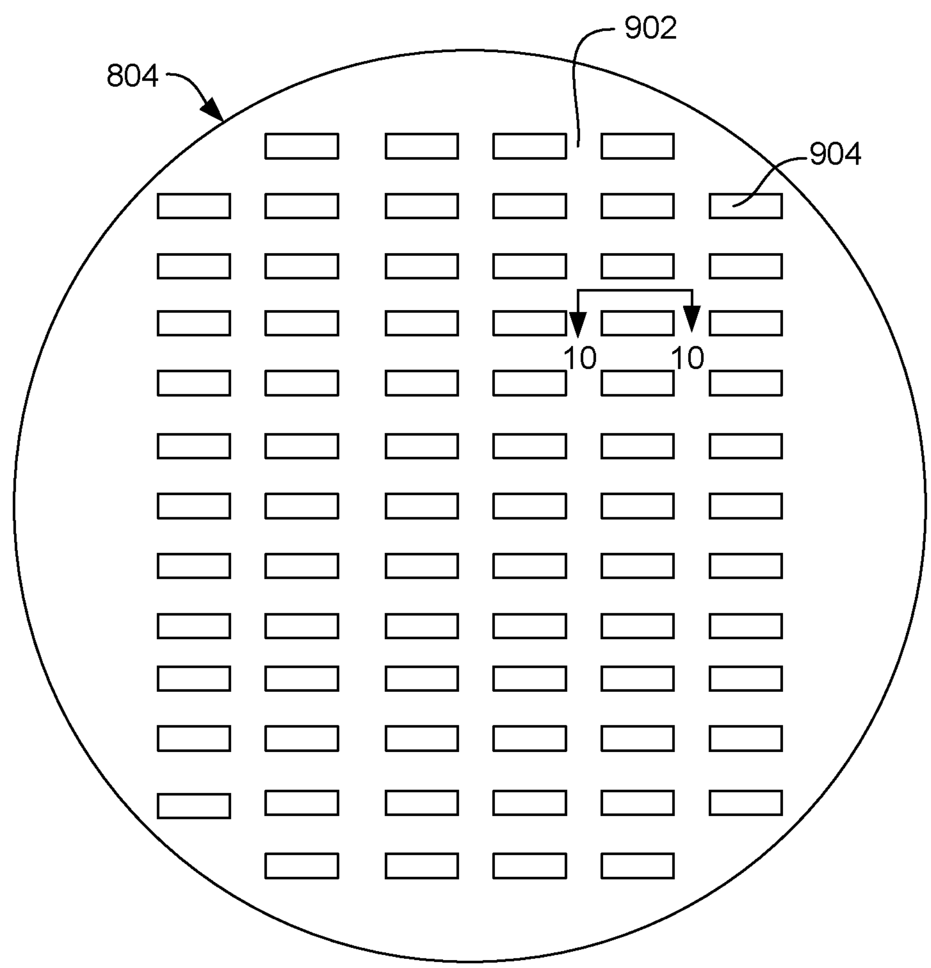

An example of such a shadow-mask can be understood more clearly with reference to FIG. 9, which shows a top down view. In FIG. 9 it can be seen that the shadow-mask 804 has openings 904 surrounded by mask portions 902. The openings 904 extend through the shadow-mask 804 to allow deposition through the openings in desired areas.

Figure 10:
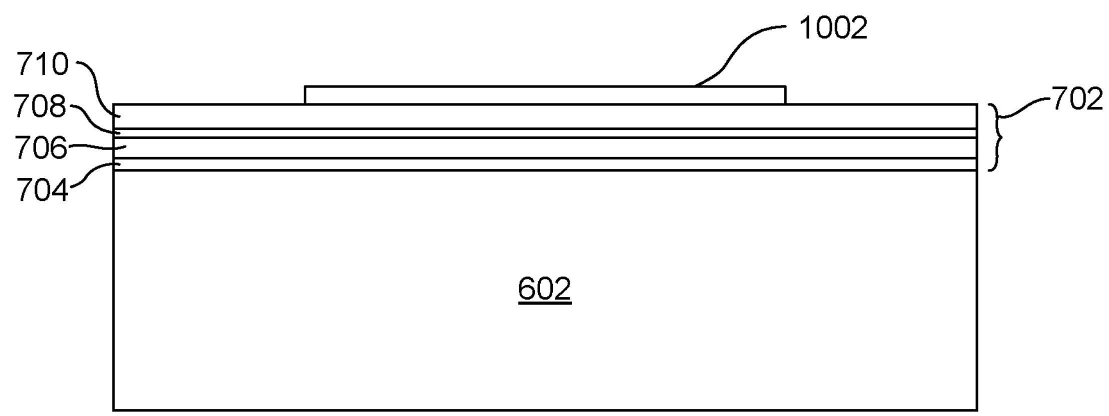

FIG. 10 is an enlarged cross-sectional view as seen from line 10-10 of FIG. 9. In FIG. 10 it can be seen that the second deposition forms an additional layer of magnetic memory element material 1002 only in selected regions, leaving surrounding regions undeposited. The layer 1002 can be referred to as a performance altering material layer, in that it is designed to alter one or more performance parameters for the memory elements in areas where it is deposited. As an example of a possible embodiment, the layer 1002 can be an additional layer of magnetic free layer material which can be the same as or different from an underlying magnetic free layer material 710. In that case, the layer 1002 could be used to increase perpendicular magnetic anisotropy of the magnetic free layer, thereby increasing data retention while also increasing latency and power consumption. This is by way of example, however, as other additional layers could be used to change performance characteristics in a magnetic memory element in other ways, such as by adding material to a magnetic reference layer to change reference layer stability or offset field.

A masking and etching step, which will be described in greater detail herein below can be used to form individual magnetic memory element pillars from the layers 702, 1002. If the thickness of the layer 1002 is not too great, the difference in thickness between areas having this additional layer 1002 and those without may have nominal effect on the masking and etching process.

Figure 11:
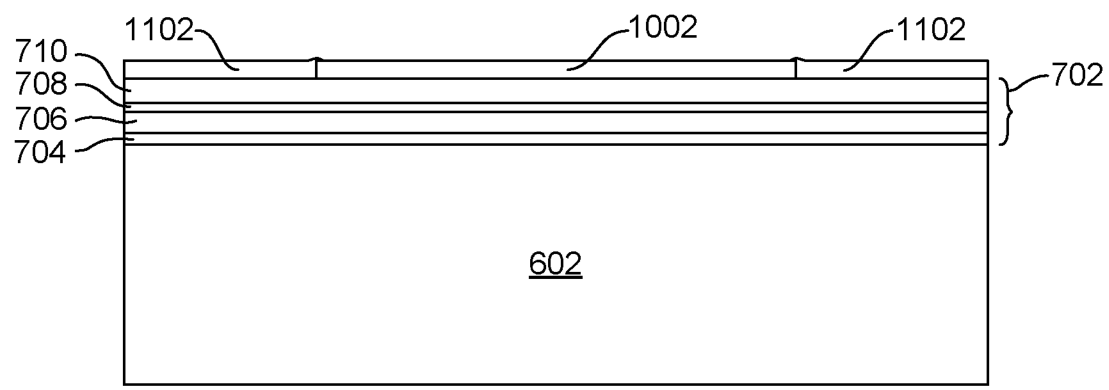
Figure 12:
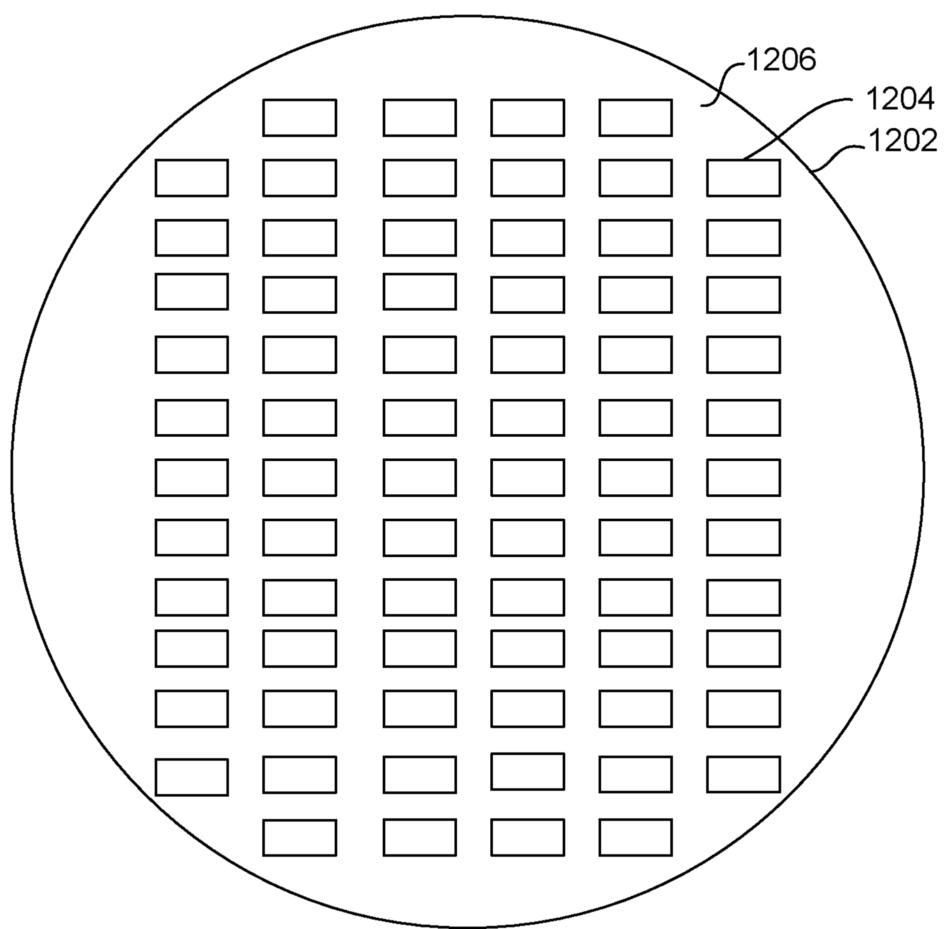

However, if closer total thickness is desired between areas having the additional layer 1002 and those without it, then an optional additional non-magnetic, electrically conductive "dummy" layer 1102 can be deposited in areas not covered by layer 1002 as shown in FIG. 11. The dummy layer 1102 can be a material that has little or no effect on the performance parameters of the magnetic elements, such as for example, an additional layer of capping material or lead material. FIG. 12 shows a top down view of a second shadow-mask 1202 that could be used to the deposition of the dummy layer 1102. This second shadow-mask 1202 has openings 1204 that are configured to expose areas that were previously covered by the first shadow-mask 804 (FIGS. 8 and 9), and which has surrounding regions 1206 that cover areas previously exposed by the first shadow-mask 804.

Figure 13:
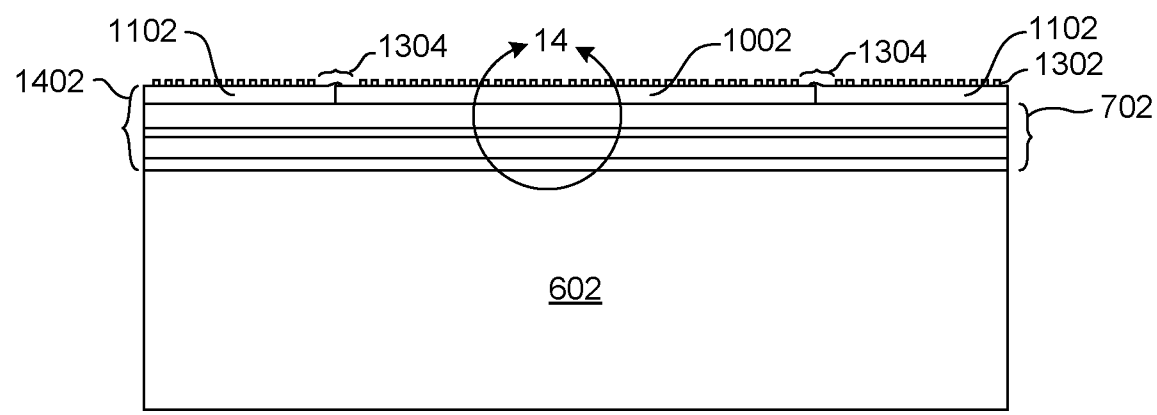
Figure 14:
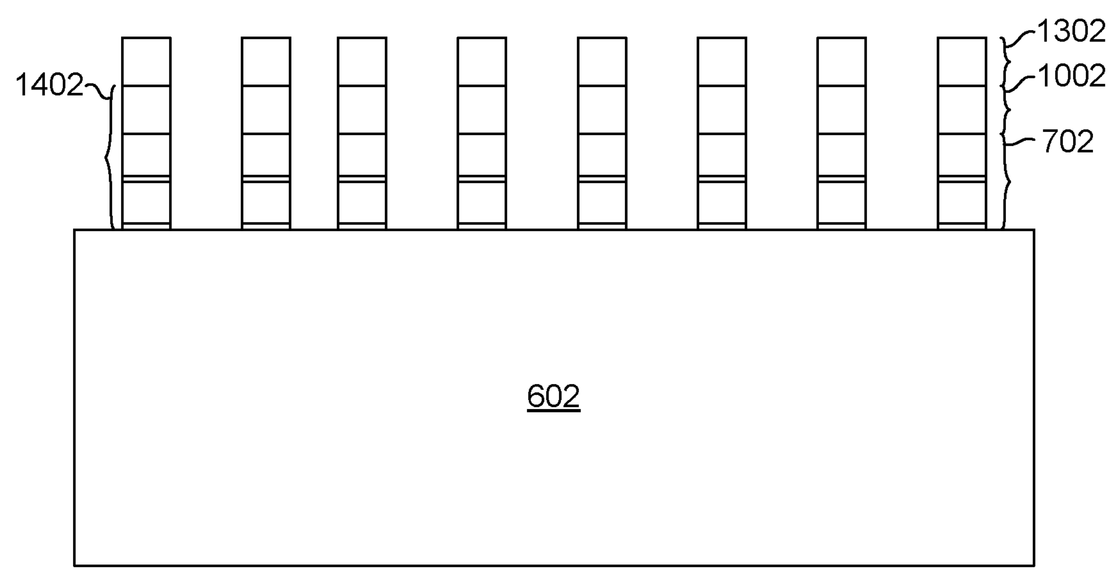

With reference now to FIG. 13, a magnetic element pillar defining mask 1302 can be deposited over the layer 1002 and over the dummy layer 1102. A material removal process such as ion milling or some other suitable process can then be performed to remove material not protected by the mask 1302, leaving an array of magnetic memory element pillars 1402 as shown in FIG. 14, which is an enlarged view as seen from circle 14 of FIG. 13. FIG. 14 shows a region having the additional layer 1002. In other regions the pillar would be have the dummy layer 1102 rather than the layer 1002.

Figure 15:
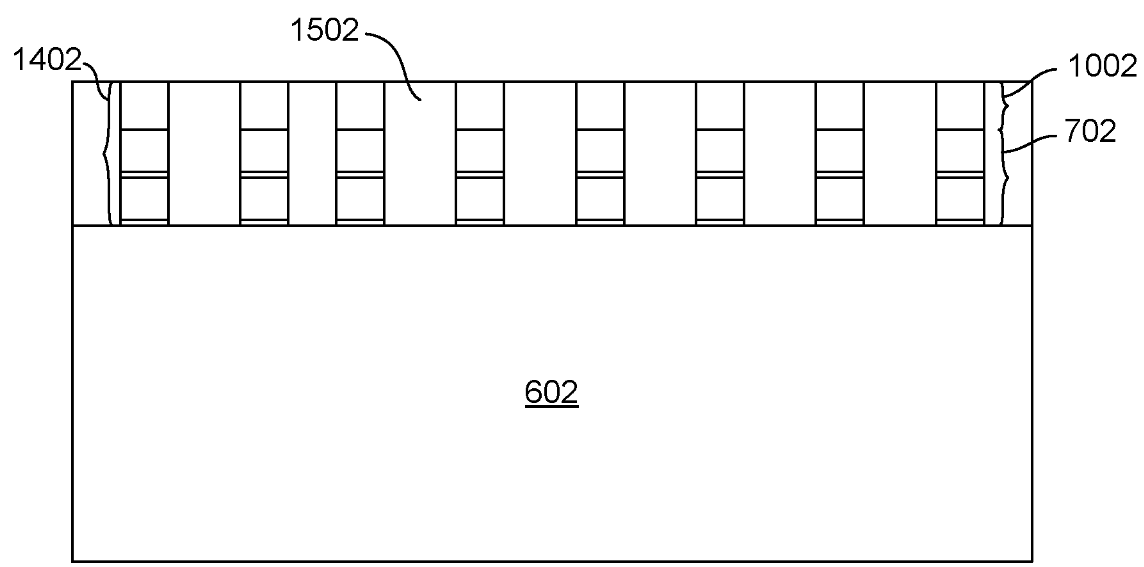

After forming the pillars, a non-magnetic, dielectric isolation material such as silicon oxide or nitride 1502 can be deposited, followed by a chemical mechanical polishing process to planarize the structure and expose the memory element pillars 1402, as shown in FIG. 15.

Figure 16:
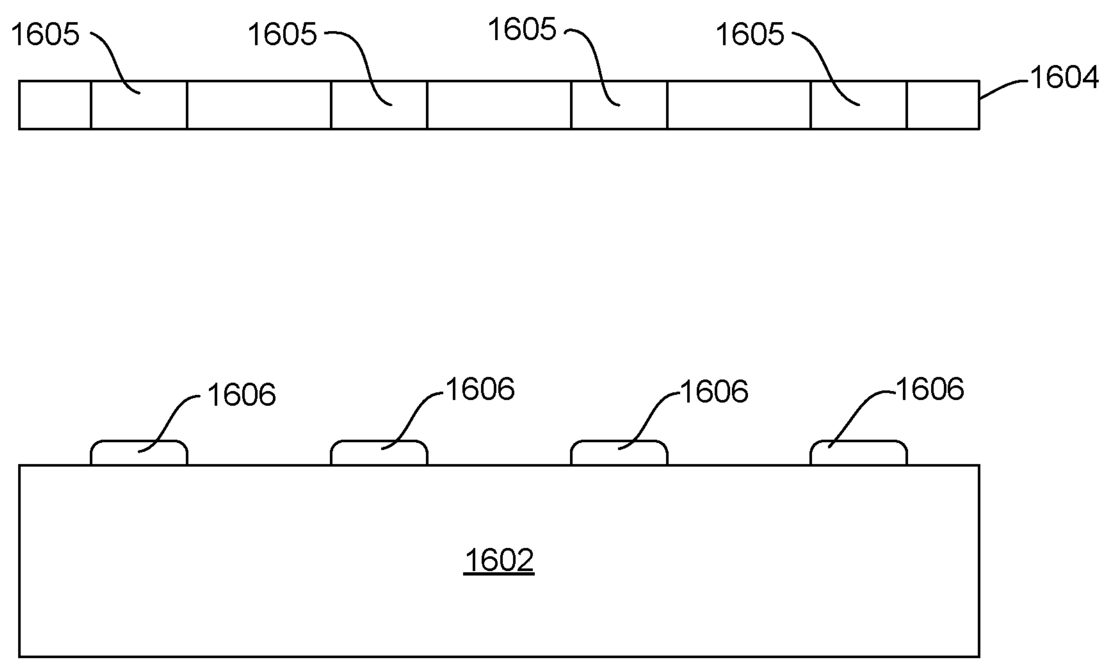
FIGS. 16-20 are views of a wafer in various intermediate stages of manufacture illustrating a method for manufacturing a magnetic memory array according to an alternate embodiment.

FIGS. 16-20 show a wafer in various intermediate stages of manufacture in order to illustrate a method for manufacturing a magnetic memory array according to another embodiment. With reference now to FIG. 16, a substrate 1602 is provide, which could include a semiconductor wafer. A first shadow-mask 1604, having holes 1605 is used for the deposition of a first series of memory element layers 1606 onto the substrate 1602. Using the first shadow-mask 1604 allows the first series of memory element layers 1606 to be deposited only in desired first regions on the substrate 1602, as shown in FIG. 16. The deposition of the first series of memory element layers 1606 can be performed, for example, by sputter deposition in a sputter deposition tool using a variety of material targets. Unlike the previously described embodiment, the first series of memory element layers 1606 can be a series of material layers making up an entire magnetic memory element type.

Figure 17:
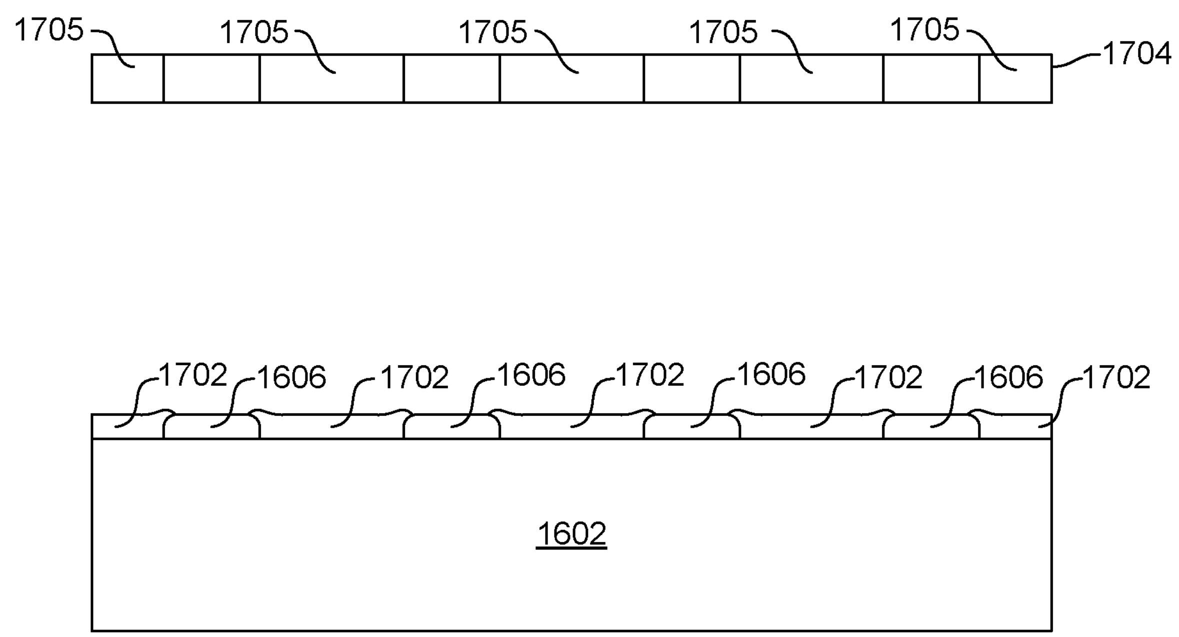

Then, with reference to FIG. 17, a second series of memory element layers 1702 is deposited using a second shadow-mask 1704, having holes 1705 that are configured to only deposit the second memory element layers 1702 in a second magnetic memory element area. As before, the deposition of the material 1702 can be performed using a suitable deposition technique such as sputter deposition. Also, the second series of magnetic element layers 1702 can be a series of layers configured to make up an entire magnetic element stack of a second type (rather than just modifying one or several layers as in the previously described embodiment. As shown in FIG. 17, some overlap of the first and second magnetic element layers 1606, 1702 is allowable, since this overlapped portion can be removed in later pillar deformation as described herein below.

Figure 18:
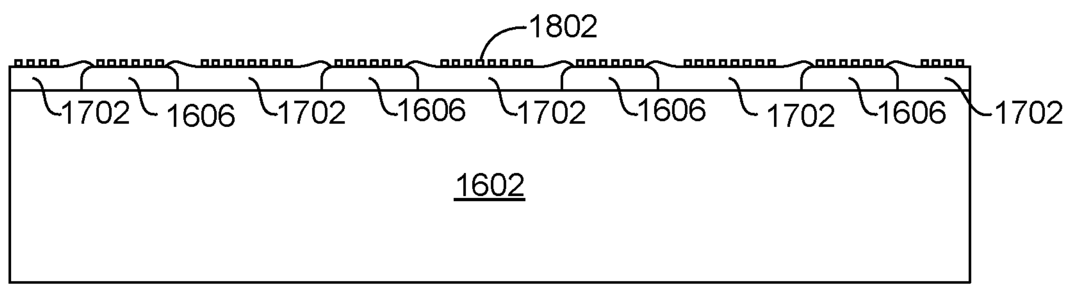

With reference now to FIG. 18, a magnetic element pillar defining mask 1802 is formed over the first and second series of memory element layers 1606, 1702. The mask 1802, which is shown in side, cross-section in FIG. 18 can include various layers, such as but not limited to, a hard mask layer, a bottom anti-reflective coating layer (BARC) a photolithographically patterned photoresist layer, etc.

Figure 19:
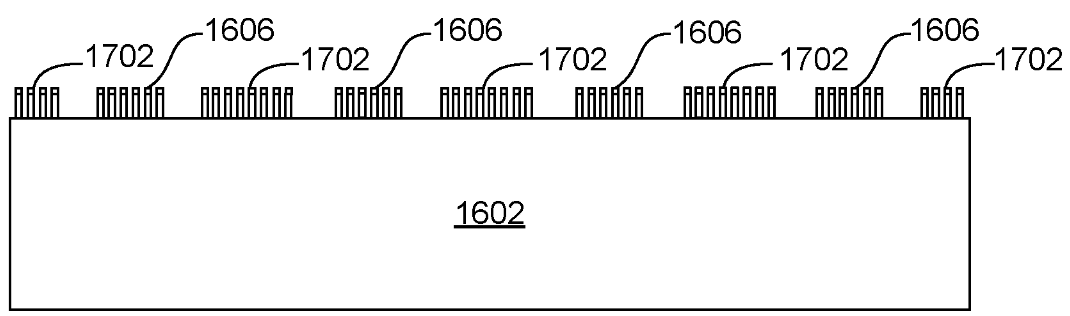
Figure 20:
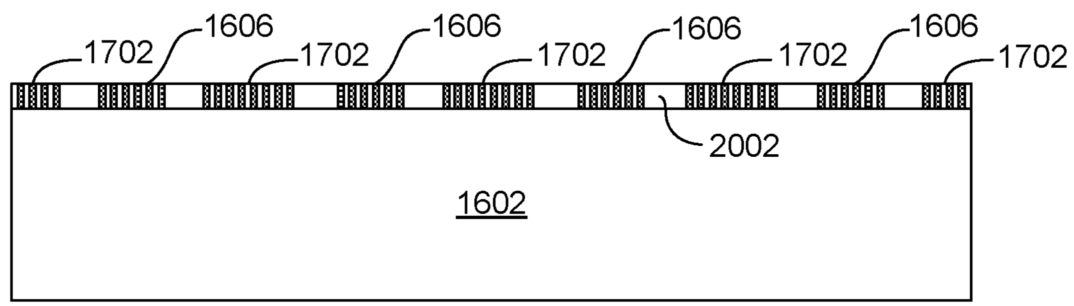

After forming the mask 1802, a material removal process can be performed to remove portions of the layers 1606, 1702 that are not protected by the mask, thereby leaving pillars of first and second magnetic element types 1606, 1702 as shown in FIG. 19. A dielectric isolation material such as silicon dioxide or silicon nitride 2002 can be deposited and a chemical mechanical polishing process can be performed, thereby leaving a structure as shown in FIG. 20 with arrays of first device type pillars 1606 certain desired areas and arrays of second device type pillars 1702 in other desired areas.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A method for manufacturing a magnetic memory array comprising:

depositing a first magnetic element material using first shadow-mask that is configured to allow deposition in a first area;

depositing a second magnetic element material using a second shadow-mask that is configured to allow deposition in a second area; and forming a mask over the first and second magnetic element material, the mask being configured to define a plurality of magnetic element pillars in the first and second areas, and performing a material removal process to remove portions of the first and second magnetic element material not protected by the mask.

2. The method as in claim 1, wherein the first magnetic element material comprises a series of layers for forming a tunnel junction magnetic memory element of a first type, and wherein the second magnetic element material comprises at least one layer of material of a tunnel junction magnetic memory element of a second type.

3. The method as in claim 1, wherein the first magnetic memory element material includes a first magnetic free layer having a first thickness, and wherein the second magnetic memory element material includes a second magnetic free layer having a second thickness that is different from the first thickness.

4. The method as in claim 1, wherein the first magnetic memory element material includes a series of layers configured to define a first magnetic tunnel junction element having a first data retention and the second magnetic memory element material includes a second series of layers configured to define a second magnetic tunnel junction element having a second data retention.

5. The method as in claim 1, wherein the first magnetic memory element material includes a series of layers configured to define a first magnetic tunnel junction element having a first switching energy and switching current and the second magnetic memory element material includes a series of layers configured to define a second magnetic tunnel junction element having a second switching energy and switching current.

6. The method as in claim 1, wherein the first magnetic memory element material includes a series of layers configured to define a first magnetic tunnel junction element having a first switching speed and the second magnetic memory element material includes a series of layers configured to define a second magnetic tunnel junction element having a second switching speed.

7. The method as in claim 1, wherein the first magnetic memory element material includes a series of layers configured to define a first magnetic tunnel junction element having a first latency and the second magnetic memory element material includes a series of layers configured to define a second magnetic tunnel junction element having a second latency.

8. The method as in claim 1, wherein the first magnetic memory element material includes a series of layers configured to define a first magnetic tunnel junction having a magnetic first free layer type and the second magnetic memory element material includes a series of layers configured to define a second magnetic tunnel junction having a second magnetic free layer type and wherein the first and second magnetic free layer types differ from one another by one or more of: thickness, insertion, insertion layer thickness, magnetic composition and boron content.

9. The method as in claim 1, wherein the first magnetic element material includes a non-magnetic barrier layer deposited by a first deposition method that may include one or more of sputtering, dc sputtering, natural oxidation, sputtering at a first temperature, depositing to a first barrier thickness or depositing to a first oxygen content and the second magnetic element material includes a second non-magnetic barrier layer deposited by a second deposition method that may include one or more of rf sputtering, dc sputtering, natural oxidation, sputtering at a second temperature, depositing to a second barrier thickness or depositing to a second oxygen content, such that the second deposition method is different from the first deposition method.

10. The method as in claim 1, wherein the first magnetic element material includes a plurality of layers configured to define a first magnetic tunnel junction type at least one layer of which has a first magnetic anisotropy and the second magnetic element material includes a plurality of layers configured to define a second magnetic tunnel junction type at least one layer of which has a second magnetic anisotropy that is different from the first magnetic anisotropy.

11. The method as in claim 1, wherein the first magnetic memory element material includes a series of layers configured to define a first magnetic tunnel junction having a first non-magnetic capping layer next to a magnetic free layer and the second magnetic memory element material includes a series of layers configured to define a second magnetic tunnel junction having a second non-magnetic capping layer next to a magnetic free layer, and wherein the first and second capping layers differ from one another by one or more of: thickness, material, composition.

12. The method as in claim 1, wherein the first magnetic element material includes a plurality of layers that define a synthetic antiferromagnetic structure and reference layer of a first type and the second magnetic element material includes a plurality of layers that define a synthetic antiferromagnetic structure and reference layer of a second type, and wherein the first type has an offset field and magnetic stability and switching current different than the second type, and wherein the first and second synthetic antiferromagnetic structures differ from one another by one or more of: repetition of the layers, deposition temperature, composition, insertion, exchange material and exchange material thickness.

* * * * *